(12) United States Patent
Lien et al.

(10) Patent No.: US 6,724,601 B2
(45) Date of Patent: Apr. 20, 2004

(54) ESD PROTECTION CIRCUIT

(75) Inventors: Chuen-Der Lien, Los Altos Hills, CA (US); Chau-Chin Wu, Cupertino, CA (US); Ta-Ke Tien, Cupertino, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 329 days.

(21) Appl. No.: 09/811,114

(22) Filed: Mar. 16, 2001

(65) Prior Publication Data

US 2002/0131221 A1 Sep. 19, 2002

(51) Int. Cl.$^7$ .................................................. H02H 9/00
(52) U.S. Cl. ........................................ 361/111; 361/560
(58) Field of Search ............................... 361/56, 212, 58, 361/91, 111, 96; 257/358, 360, 363; 327/78, 312, 65

(56) References Cited

U.S. PATENT DOCUMENTS

| 4,399,372 A | * | 8/1983 | Tanimoto et al. | ............ 327/526 |
| 4,821,089 A | | 4/1989 | Strauss | ............ 357/68 |
| 4,835,417 A | * | 5/1989 | Kousaka et al. | ............... 327/78 |
| 5,157,573 A | * | 10/1992 | Lee et al. | ...................... 361/56 |
| 5,237,395 A | * | 8/1993 | Lee | ............................. 257/358 |
| 5,477,413 A | * | 12/1995 | Watt | ............................. 361/56 |
| 5,479,039 A | | 12/1995 | Lien | .............................. 257/356 |
| 5,532,620 A | * | 7/1996 | Seo et al. | ....................... 326/81 |
| 5,740,000 A | | 4/1998 | Stackhouse et al. | .......... 361/56 |
| 5,825,603 A | | 10/1998 | Parat et al. | ................... 361/111 |
| 5,956,219 A | | 9/1999 | Maloney | ....................... 361/56 |
| 6,040,968 A | | 3/2000 | Duvvury et al. | ............... 361/56 |
| 6,069,782 A | | 5/2000 | Lien et al. | .................... 361/111 |
| 6,118,640 A | | 9/2000 | Kwong | .......................... 361/56 |
| 6,125,021 A | | 9/2000 | Duvvury et al. | ............... 361/56 |

\* cited by examiner

*Primary Examiner*—Rajnikant B. Patel
(74) *Attorney, Agent, or Firm*—Bever, Hoffman & Harms, LLP

(57) ABSTRACT

An integrated circuit having an electrostatic discharge (ESD) protection circuit, a core protection circuit, a sensitive core circuit and peripheral circuitry is provided. The ESD protection circuit is coupled between the $V_{DD}$ voltage supply terminal and the $V_{SS}$ voltage supply terminal, and is capable of providing protection to the peripheral circuitry. The ESD protection circuitry requires help from core protection circuit to protect the sensitive core circuit. The core protection circuit and the sensitive core circuit are coupled in series between the $V_{DD}$ and $V_{SS}$ voltage supply terminals, with the core protection circuit coupled to the $V_{DD}$ voltage supply terminal. The sensitive core circuit has a $V_{CC}$ voltage supply terminal coupled to receive a $V_{CC}$ supply voltage from the core protection circuit. The core protection circuit is configured to cause the $V_{CC}$ supply voltage to rise slowly with respect to a rising voltage on the $V_{DD}$ voltage supply terminal during power-on of the integrated circuit. The core protection circuit is further configured to disconnect the $V_{CC}$ voltage supply terminal from the $V_{DD}$ voltage supply when a voltage on the $V_{DD}$ voltage supply terminal exceeds the nominal $V_{DD}$ supply voltage by a predetermined amount.

29 Claims, 3 Drawing Sheets

ESD PROTECTION CIRCUIT

BACKGROUND OF THE INVENTION

1. Field of the Invention

The present invention relates to a circuit for providing protection from electrostatic discharge (ESD) on an integrated circuit chip.

2. Related Art

ESD protection circuitry is well known to integrated circuit designers. In general, ESD protection circuitry is provided to protect the input/output circuitry and core circuitry of an integrated circuit from large and sudden discharges of electrostatic energy. Various ESD events include discharge between pads of the integrated circuit, between voltage supply terminals of the integrated circuit and between pads and voltage supply terminals of the integrated circuit. ESD protection circuitry has been designed to protect from ESD events that occur during testing and ESD events that occur during normal operation of the integrated circuit.

Examples of ESD protection circuits can be found in U.S. Pat. Nos. 5,740,000, 6,040,968, 6,125,021, 6,118,640, 5,825,603 and 5,956,219.

As the feature sizes of integrated circuits are scaled down, the various elements of the integrated circuits become more susceptible to damage from ESD events. It would therefore be desirable to have improved ESD protection circuits.

SUMMARY

Accordingly, the present invention provides an integrated circuit having an electrostatic discharge (ESD) protection circuit, a core protection circuit, a sensitive core circuit and peripheral circuitry. The ESD protection circuit is coupled between the $V_{DD}$ voltage supply terminal and the $V_{SS}$ voltage supply terminal, and is capable of providing protection to the peripheral circuitry. The ESD protection circuitry requires help from core protection circuit to protect the sensitive core circuit. The sensitive core circuit includes circuit elements that are particularly susceptible to ESD events, such as six-transistor SRAM cells.

The core protection circuit and the sensitive core circuit are coupled in series between the $V_{DD}$ and $V_{SS}$ voltage supply terminals, with the core protection circuit coupled to the $V_{DD}$ voltage supply terminal. The sensitive core circuit has a $V_{CC}$ voltage supply terminal coupled to receive a $V_{CC}$ supply voltage from the core protection circuit. The core protection circuit is configured to cause the $V_{CC}$ supply voltage to rise slowly with respect to a rising voltage on the $V_{DD}$ voltage supply terminal during power-on of the integrated circuit. The core protection circuit can further be configured to disconnect the $V_{CC}$ voltage supply terminal from the $V_{DD}$ voltage supply when a voltage on the $V_{DD}$ voltage supply terminal exceeds the nominal $V_{DD}$ supply voltage by a predetermined amount.

In a particular embodiment, the core protection circuit includes a p-channel transistor having a source coupled to the $V_{DD}$ supply terminal, a drain coupled to the $V_{CC}$ supply terminal, and a gate coupled to the $V_{SS}$ supply terminal. In this embodiment, the resistance of the p-channel transistor and the capacitance of the sensitive core circuit create an RC delay circuit having a time constant large enough to cause the p-channel transistor to turn on slowly during power on. As a result, the ESD protection circuit will have adequate time to turn on before current through the sensitive core circuit can become high enough to cause any damage to the sensitive core circuit. In another embodiment, a resistor can be added in parallel with the p-channel transistor, thereby enhancing the slow turn on of the p-channel transistor.

In another embodiment, the gate of the p-channel transistor is coupled to a switch control circuit, which uses a delay circuit to slow down the turn on of the p-channel transistor during power on. In yet another embodiment, the switch control circuit is configured to quickly turn off the p-channel transistor when the voltage on the $V_{DD}$ supply terminal exceeds a predetermined voltage during normal operation of the integrated circuit. In this case, the core protection circuit advantageously protects the sensitive core circuit from ESD events that occur during normal operating conditions.

The present invention will be more fully understood in view of the following description and drawings.

DETAILED DESCRIPTION

Figure 1:
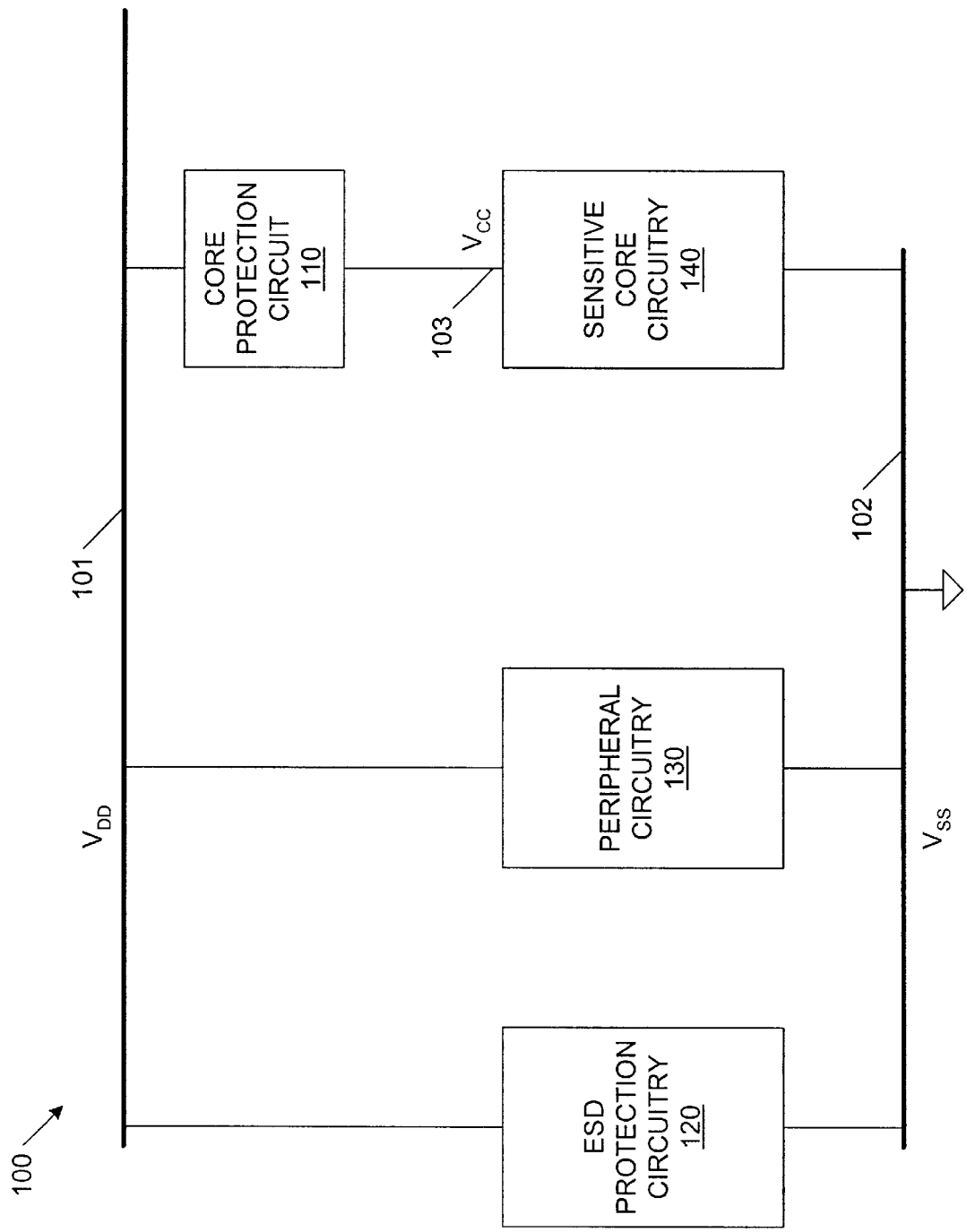
FIG. 1 is a block diagram of an integrated circuit in accordance with one embodiment of the present invention.

FIG. 1 is a block diagram of an integrated circuit 100 in accordance with one embodiment of the present invention. Integrated circuit 100 includes $V_{DD}$ voltage supply terminal 101, $V_{SS}$ voltage supply terminal 102, $V_{CC}$ voltage supply terminal 103, core protection circuit 110, ESD protection circuitry 120, peripheral circuitry 130, and sensitive core circuitry 140. Core protection circuit 110 and sensitive core circuitry 140 are connected in series between $V_{DD}$ supply terminal 101 and $V_{SS}$ supply terminal 102, with core protection circuit 110 being connected to $V_{DD}$ supply terminal 101. ESD protection circuit 120 and peripheral circuitry 130 are connected between $V_{DD}$ supply terminal 101 and $V_{SS}$ supply terminal 102.

In the described examples, integrated circuit 100 is fabricated using a 0.18 micron CMOS logic process. The $V_{DD}$ voltage supply terminal 101 is maintained at a nominal voltage of 3.3 Volts. The $V_{DD}$ supply voltage is allowed to vary +/−10% from the nominal voltage during the normal operation of integrated circuit 100. The $V_{DD}$ supply voltage is raised to a voltage of about 1.35 times the nominal $V_{DD}$ voltage during burn-in of integrated circuit 100. The $V_{SS}$ supply voltage is held at ground (0 Volts). In other embodiments, other processes and/or supply voltages can be used.

In the described embodiments, ESD protection circuitry 120 is a conventional protection circuit, which provides protection for ESD events occurring across $V_{DD}$ supply terminal 101 and $V_{SS}$ supply terminal 102. For example, ESD protection circuit 120 can include circuitry described in U.S. Pat. Nos. 4,821,089, 5,479,039 and 6,069,782, which are hereby incorporated by reference. However, other ESD protection circuitry can be used in other embodiments. In general, ESD protection circuitry 120 is capable of protecting peripheral circuitry 130, without any additional assistance from core protection circuit 103. However, ESD protection circuitry 120, by itself, is not capable of protecting sensitive core circuitry 140.

In the described embodiments, sensitive core circuitry 140 includes an array of 6-transistor (6-T) SRAM cells. However, in other embodiments, sensitive core circuitry 140 can include other circuitry that is particularly susceptible to ESD events.

Figure 2:
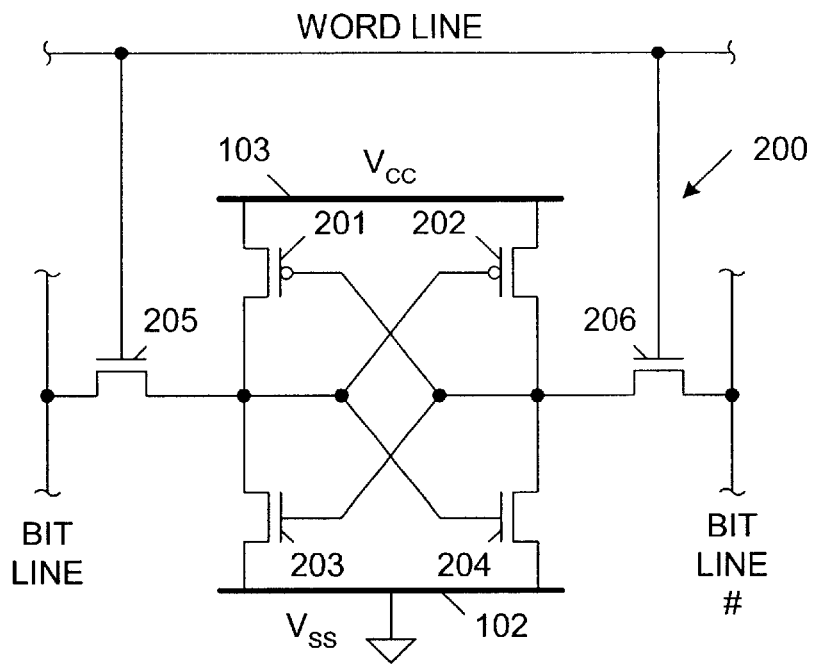
FIG. 2 is a circuit diagram of a 6-T SRAM cell that is used in sensitive core circuitry of the described embodiments.

FIG. 2 is a circuit diagram of a 6-T SRAM cell 200 that is used in sensitive core circuitry 140 in the described embodiments. 6-T SRAM cell 200 includes p-channel transistors 201–202 and n-channel transistors 203–206. The sources of p-channel transistors 201–202 are coupled to $V_{CC}$ voltage supply terminal 103, which in turn, is coupled to core protection circuit 110.

Within a conventional 6-T SRAM cell, the sources of p-channel transistors 201–202 would be connected directly to $V_{DD}$ supply terminal 101. Such a connection may be acceptable when the 6-T SRAM cell is fabricated using a CMOS logic process having a minimum feature size of 0.25 microns or greater. In this case, p-channel transistors 201–202 would have relatively thick gate oxides, such that these transistors may be safely coupled directly to the $V_{DD}$ voltage supply terminal. During an ESD event, a corresponding ESD protection circuit will turn on before a damaging voltage can be developed across the p-channel transistors.

However, for processes having minimum feature sizes of 0.18 microns or less, the gate oxide thickness of p-channel transistors 201–202 must be made significantly smaller, or these transistors will be too slow to be used in the 6T SRAM cell. P-channel transistors having such a small gate oxide thickness may not be safely coupled directly to the $V_{DD}$ voltage supply terminal. This is because the ESD voltages do not scale down with the gate oxide thickness. Thus, during an ESD event, a corresponding ESD protection circuit may not have time to turn on before a damaging voltage is developed across the p-channel transistors.

As described in more detail below, core protection circuit 110 initially prevents large currents from flowing through sensitive core circuitry 140 during ESD events, thereby allowing adequate time for ESD protection circuitry 120 to turn on and dissipate the ESD current.

In the described embodiments, peripheral circuitry 130 includes the circuitry required to access sensitive core circuitry 140. For example, peripheral circuitry 130 can include input/output (I/O) circuits, row and column address decoders, and other circuitry required to access the array of 6-T SRAM cells. In general, the elements of peripheral circuitry 130 do not need to switch as fast as the 6T SRAM cells in sensitive core circuitry 140. Consequently, the transistors of peripheral circuitry 130 are fabricated with thicker gate oxides than the transistors of sensitive core circuitry 140. As a result, the transistors in peripheral circuitry 130 are not as sensitive to ESD events as the transistors in sensitive core circuit 140.

Figure 3:
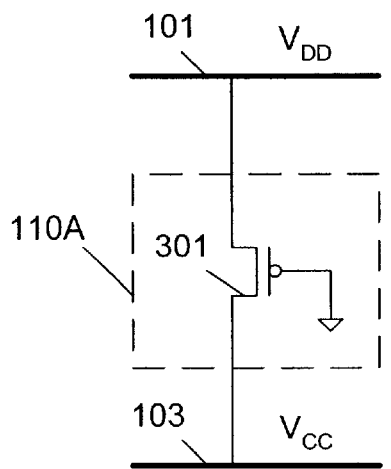
FIG. 3 is a circuit diagram of a core protection circuit that protects the sensitive core circuit of FIG. 1 in accordance with one embodiment of the invention.

FIG. 3 is a circuit diagram of core protection circuit 110A, which can be used to implement core protection circuit 110 in accordance with one embodiment of the invention. In this embodiment, core protection circuit 110A includes a p-channel transistor 301 having a source coupled to the $V_{DD}$ supply terminal 101, a drain coupled to $V_{CC}$ supply terminal 103 of sensitive core circuitry 140, and a gate coupled to ground (i.e., $V_{SS}$ supply terminal 102). P-channel transistor 301 turns on slowly, thereby protecting sensitive core circuitry 140 from a large ESD voltage applied to $V_{DD}$ supply terminal 100 during (or before) power up of integrated circuit 100. P-channel transistor 301 is a relatively large transistor. In one embodiment, wherein sensitive core circuit 140 includes a 1 Mbit array of 6T SRAM cells, and $V_{DD}$ supply terminal 101 receives a voltage of 3.3 Volts, p-channel transistor 301 has a channel width of 80 microns, a channel length of 0.28 microns and a resistance of 100 ohms. In the described embodiments, after being turned on, p-channel transistor 301 has a linear resistance of about 100 ohms for each megabit of capacity in the memory array of sensitive core circuitry 140. The resistance of p-channel transistor 301 combined with the capacitance of sensitive core circuitry 140 results in a circuit having a relatively high RC time constant (e.g., greater than 100 ns and less than 1 ms). Thus, during power on (or during an ESD event prior to power on), p-channel transistor 301 turns on slowly. Consequently, if an ESD charge is applied to $V_{DD}$ supply terminal 101 during (or before) power up of integrated circuit 100, p-channel transistor 301 turns on slowly, thereby preventing the ESD charge from flowing to sensitive core circuitry 140, and providing sufficient time for ESD protection circuitry 120 to be enabled. As a result, the ESD charge is shunted to ESD protection circuitry 120, without damaging sensitive core circuitry 140.

Figure 4:
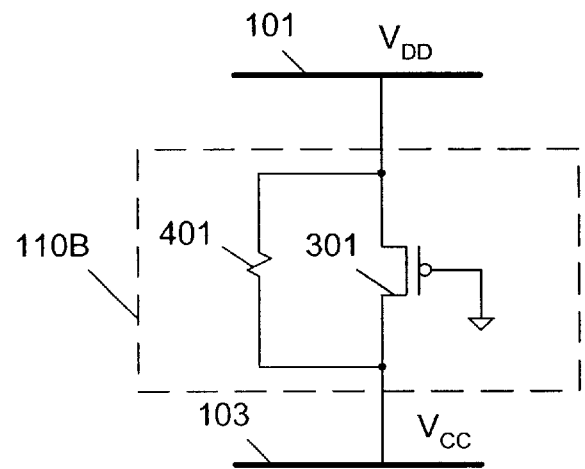
FIG. 4 is a circuit diagram of a core protection circuit in accordance with another embodiment of the invention.

FIG. 4 is a circuit diagram of core protection circuit 110B, which can be used to implement core protection circuit 110 in accordance with another embodiment of the invention. Core protection circuit 110B includes resistor 401 connected in parallel with p-channel transistor 301. In the described embodiment, resistor 401 has a resistance (R) that is determined as follows.

$$R = (1000 \text{ to } 2000 \text{ ohms}) \times 1024^2 \text{ memory cells} \div (\text{Number of memory cells in the array})$$

For example if the array in sensitive core circuit 140 includes 2 megabits, then a resistor of 500 to 1000 ohms is used. If the array includes 0.5 megabits, then a resistor of 2000 to 4000 ohms is required. In the present example, resistor 401 is fabricated in a p+ type island of a semiconductor substrate. In general, resistor 401 enhances the slow turn on characteristics of p-channel transistor 301. That is, resistor 401 increases the time constant of the circuit formed by core protection circuit 110B and sensitive core circuit 140. As a result, resistor 401 enhances the slow rise in current flow to sensitive core circuit 140 during power on.

Figure 5:
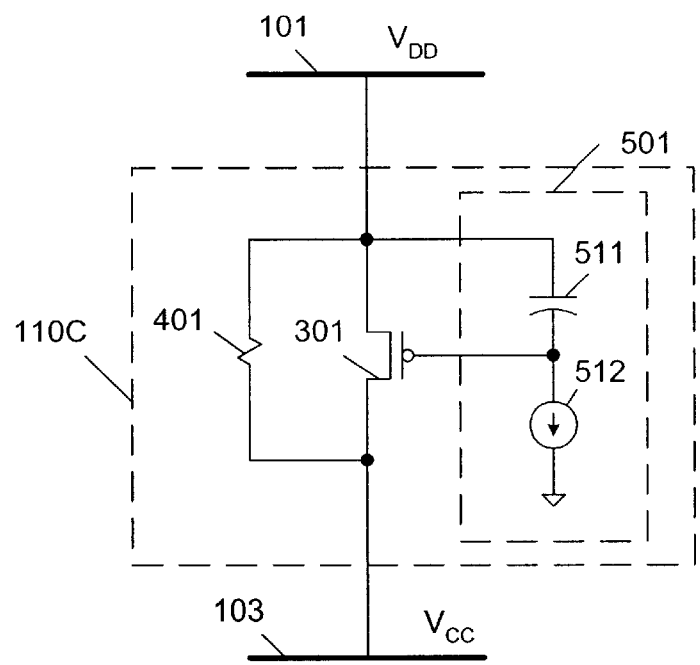
FIG. 5 is a circuit diagram of a core protection circuit, which that implements a switch control circuit in accordance with another embodiment of the invention.

FIG. 5 is a circuit diagram of core protection circuit 110C, which can be used to implement core protection circuit 110 in accordance with another embodiment of the invention. In addition to p-channel transistor 301 and resistor 401, core protection circuit 110C includes switch control circuit 501. Switch control circuit 501 is coupled to the gate of p-channel transistor 301 and to $V_{DD}$ supply terminal 101. In general, switch control circuit 501 causes p-channel transistor 301 to turn on slowly during the power on of integrated circuit 100.

Switch control circuit 501 includes capacitor 511 and constant current source 512. In the described embodiment, capacitor 511 is formed by a p-channel transistor having source, drain and well regions commonly connected to $V_{DD}$ supply terminal 101, and a gate electrode connected to the gate of transistor 301. The p-channel transistor used to form capacitor 511 has a width-to-length ratio of 1200:5 in one embodiment. Constant current source 512, which is coupled between the gate of transistor 301 and $V_{SS}$ supply terminal 102, is an element that is known to those of ordinary skill in the art. Current source 512, which is configured to provide a constant, relatively low current flow of about 5 microamps, has a relatively high equivalent resistance. Thus, capacitor 511 and current source 512 provide an RC delay circuit.

When integrated circuit 100 is initially powered on, the voltage on $V_{DD}$ supply terminal 101 is applied to the gate of p-channel transistor 301 through capacitor 511, thereby turning off transistor 301. Subsequently, capacitor 511 slowly charges, thereby pulling the gate of p-channel transistor 301 down toward ground. Eventually, the voltage applied to the gate of p-channel transistor 301 becomes low enough to turn on this transistor. The time required to turn on transistor 301 is determined by the time constant defined by the capacitance of capacitor 511 and the resistance of constant current source 512. In one embodiment, the turn on time constant is greater than 100 ns and less than 10 ms. Thus, if an ESD event occurs during or prior to power on, transistor 301 will turn on slowly, thereby allowing ESD protection circuit 120 to turn on before significant current can flow through sensitive core circuit 140.

The core protection circuits 110A–110C of FIGS. 3–5 provide protection to sensitive core circuitry 140 when there is an ESD event on $V_{DD}$ supply terminal 101 during (or before) power on of integrated circuit 100. However, it would be desirable to provide further protection to sensitive core circuitry 140 after power on of integrated circuit 100.

Figure 6:
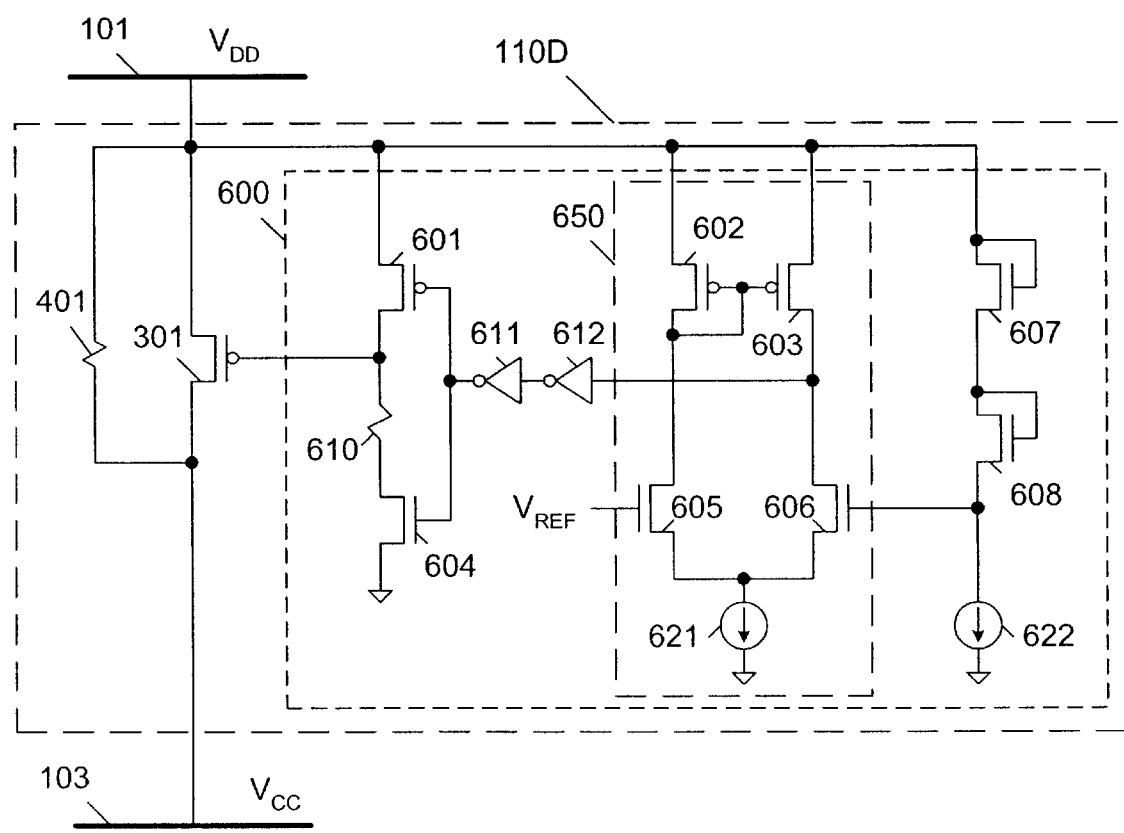
FIG. 6 is a circuit diagram of a core protection circuit that protects the sensitive core circuit of FIG. 1 during both power on and normal operation.

FIG. 6 is a circuit diagram of core protection circuit 110D, which can be used to implement core protection circuit 110 in accordance with another embodiment of the invention. In addition to p-channel transistor 301 and resistor 401, core protection circuit 110D includes switch control circuit 600. Switch control circuit 600 is coupled to the gate of p-channel transistor 301 and to $V_{DD}$ supply terminal 101. In general, switch control circuit 600 causes p-channel transistor 301 to turn on slowly during the power on of integrated circuit 100. In addition, switch control circuit 600 causes p-channel transistor to turn off quickly when an ESD event occurs on $V_{DD}$ supply terminal 101 during normal operation of integrated circuit 100.

Switch control circuit 600 includes p-channel transistors 601–603, n-channel transistors 604–608, resistor 610, inverters 611–612 and constant current sources 621–622. p-channel transistors 602–603, n-channel transistors 605–606 and constant current source 621 are configured to form a comparator circuit 650. A reference voltage $V_{REF}$ is applied to a first input terminal of comparator 650 (i.e., to the gate of n-channel transistor 605). The reference voltage $V_{REF}$ is a predetermined constant voltage, which is selected as described below. The second input terminal of comparator 650 (i.e., the gate of transistor 606) is coupled to receive the voltage on $V_{DD}$ supply terminal 101 through diode-connected transistors 607–608. The voltage on the second input terminal of comparator 650 is therefore equal to the voltage on $V_{DD}$ supply terminal 101 minus two diode voltage drops. Constant current source 622 provides for current flow through diode-connected transistors 607–608.

If the voltage on the gate of transistor 606 is greater than the reference voltage $V_{REF}$, then comparator 650 provides a logic low output signal to the input terminal of inverter 612. Conversely, if the voltage on the gate of transistor 606 is less than the reference voltage $V_{REF}$, then comparator 650 provides a logic high output signal to the input terminal of inverter 612.

Switch control circuit 600 operates as follows in accordance with one embodiment of the present invention. During power on of integrated circuit 100, the voltage on $V_{DD}$ supply terminal 101 increases from zero Volts. Until the voltage on $V_{DD}$ supply terminal 101 reaches a voltage greater than two diode voltage drops, constant current source 622 pulls the gate of transistor 606 down to ground. After the voltage on $V_{DD}$ supply terminal 101 becomes greater than two diode voltage drops, the voltage on the gate of transistor 606 is equal to the voltage on $V_{DD}$ supply terminal 101 minus two diode voltage drops.

The reference voltage $V_{REF}$ is selected to be equal to the nominal $V_{DD}$ supply voltage times a predetermined value greater than one. In the described embodiment, $V_{REF}$ is selected to be 1.45 times the nominal $V_{DD}$ supply voltage of 3.3 Volts, or about 4.8 Volts.

During power up, the voltage applied to the gate of transistor 606 is less than the reference voltage $V_{REF}$. As a result, the voltage on the output terminal of comparator 650 is pulled up to a logic high voltage. In response, inverter 611 provides a logic high signal to the gates of transistors 601 and 604, thereby turning on transistor 604 and turning off transistor 601. Transistor 604 thereby pulls down the gate of transistor 301 through resistor 610. In the described embodiment, resistor 610 has a value of about 10,000 ohms, and transistor 604 is a relatively small transistor, having a width of about 2 microns and a length of about 0.25 microns. As a result, transistor 301 is turned on slowly during power on. Consequently, current to sensitive core circuit 140 is advantageously limited during power on, thereby protecting sensitive core circuit 140 from ESD events during at this time.

During normal operation (and during burn-in, which is performed with the $V_{DD}$ supply voltage equal to about 4.5 Volts), the voltage applied to the gate of transistor 606 remains less than the reference voltage $V_{REF}$. As a result, p-channel transistor 301 remains turned on, with transistor 604 pulling down the voltage on the gate of p-channel transistor 301.

If an ESD event occurs on $V_{DD}$ supply terminal 101 during normal operation (or during burn-in), and the voltage on VDD supply terminal 101 exceeds the reference voltage $V_{REF}$ plus two diode voltage drops, then comparator 650 will provide a logic low output voltage to inverter 612. In response, inverter 611 provides a logic low voltage to the gates of transistors 601 and 604, thereby turning on p-channel transistor 601 and turning off n-channel transistor 604. As a result, the gate of p-channel transistor 301 is pulled up to the voltage on $V_{DD}$ supply terminal 101 through turned on transistor 601. Because transistor 601 is a relatively large transistor (e.g., having a width of about 400 microns and a length of about 0.28 microns), and there is no resistor connected in the path from the gate of transistor 301 to the $V_{DD}$ supply terminal 101, transistor 601 is turned off quickly. In one embodiment, transistor 601 is turned off in less than 100 pico-seconds. Thus, sensitive core circuit 140 is quickly disconnected from $V_{DD}$ supply terminal 101 when an ESD event occurs on $V_{DD}$ supply terminal 101 during normal operation (or burn-in) of integrated circuit 100.

In the foregoing manner, core protection circuit 110D provides ESD protection for sensitive core circuit 140 both during power on and during normal operation of integrated circuit 100.

Although the invention has been described in connection with several embodiments, it is understood that this invention is not limited to the embodiments disclosed, but is capable of various modifications which would be apparent to a person skilled in the art. Thus, the invention is limited only by the following claims.

What is claimed is:

1. An integrated circuit comprising:
   a $V_{DD}$ voltage supply terminal;
   a $V_{SS}$ voltage supply terminal;
   an electrostatic discharge (ESD) protection circuit coupled between the $V_{DD}$ voltage supply terminal and the $V_{SS}$ voltage supply terminal;
   a core protection circuit coupled to the $V_{DD}$ voltage supply terminal; and
   a core circuit coupled between the core protection circuit and the $V_{SS}$ voltage supply terminal, the core circuit having a $V_{CC}$ voltage supply terminal coupled to receive a $V_{CC}$ supply voltage from the core protection circuit, wherein the core protection circuit is configured to cause the $V_{CC}$ supply voltage to rise slowly with respect to a rising voltage on the $V_{DD}$ voltage supply terminal during power-on of the integrated circuit.

2. The integrated circuit of claim 1, further comprising a peripheral circuit coupled between the $V_{DD}$ voltage supply terminal and the $V_{SS}$ voltage supply terminal, wherein the peripheral circuit controls the operation of the core circuit, and wherein the core circuit is more sensitive than the peripheral circuit to ESD events occurring on the $V_{DD}$ voltage supply terminal.

3. The integrated circuit of claim 2, wherein the ESD protection circuit is configured to protect the peripheral circuit during an ESD event, without assistance from the core protection circuit.

4. The integrated circuit of claim 1, wherein the core circuit comprises an array of six-transistor (6-T) static random access memory (SRAM) cells.

5. The integrated circuit of claim 4, wherein the 6-T SRAM cells have a minimum feature size of 0.18 microns or less.

6. The integrated circuit of claim 4, wherein the core protection circuit comprises a p-channel transistor coupled between the $V_{DD}$ voltage supply terminal and the $V_{CC}$ voltage supply terminal.

7. The integrated circuit of claim 6, wherein the core protection circuit further comprises a resistor coupled between the $V_{DD}$ voltage supply terminal and the $V_{CC}$ voltage supply terminal.

8. The integrated circuit of claim 7, wherein the resistor has a resistance in ohms equal to 1000 to 2000 ohms times one megabit divided by a number of megabits in the array.

9. The integrated circuit of claim 4, wherein the peripheral circuit comprises row and column decoding circuitry for the array.

10. The integrated circuit of claim 1, wherein the core protection circuit comprises a p-channel transistor having a source coupled to the $V_{DD}$ voltage supply terminal, a gate coupled to the $V_{SS}$ voltage supply terminal, and a drain coupled to the $V_{CC}$ voltage supply terminal in the core circuit.

11. The integrated circuit of claim 10, wherein the switch further comprises a resistor coupled between the $V_{DD}$ voltage supply terminal and the $V_{CC}$ voltage supply terminal in the core circuit.

12. The integrated circuit of claim 1, wherein the core protection circuit comprises:
   a p-channel transistor having a source coupled to the $V_{DD}$ voltage supply terminal and a drain coupled to the $V_{CC}$ voltage supply terminal in the core circuit;
   a capacitor having a first terminal coupled to the $V_{DD}$ voltage supply terminal and a second terminal coupled to a gate of the p-channel transistor; and
   a constant current source having a first terminal coupled to the gate of the p-channel transistor and a second terminal coupled to the $V_{SS}$ voltage supply terminal.

13. The integrated circuit of claim 12, wherein the constant current source draws a current of about 5 micro-amps.

14. The integrated circuit of claim 12, wherein the capacitor and constant current source exhibit a time constant greater than 100 nanoseconds and less than 1 milli-second.

15. The integrated circuit of claim 12, wherein the core protection circuit further comprises a resistor coupled between the $V_{DD}$ voltage supply terminal and the $V_{CC}$ voltage supply terminal in the core circuit.

16. The integrated circuit of claim 1, wherein a nominal $V_{DD}$ supply voltage is applied to the $V_{DD}$ voltage supply terminal during normal operation of the integrated circuit, and wherein the core protection circuit is further configured to disconnect the $V_{CC}$ voltage supply terminal from the $V_{DD}$ voltage supply when a voltage on the $V_{DD}$ voltage supply terminal exceeds a predetermined voltage greater than the nominal $V_{DD}$ supply voltage.

17. The integrated circuit of claim 16, wherein the predetermined voltage greater than the nominal $V_{DD}$ supply voltage is about 1.45 times the nominal $V_{DD}$ supply voltage.

18. The integrated circuit of claim 16, wherein the core protection circuit is configured to disconnect the $V_{CC}$ voltage supply terminal from the $V_{DD}$ voltage supply less than 100 pico-seconds after the voltage on the $V_{DD}$ voltage supply terminal exceeds the predetermined voltage.

19. The integrated circuit of claim 16, wherein the core protection circuit comprises:
   a first p-channel transistor having a source coupled to the $V_{DD}$ voltage supply terminal and a drain coupled to the $V_{CC}$ voltage supply terminal in the core circuit;
   a control circuit coupled to a gate of the first p-channel transistor.

20. The integrated circuit of claim 19, wherein the control circuit comprises:
   a comparator having a first input terminal coupled to receive a first voltage corresponding with a voltage on the $V_{DD}$ voltage supply terminal, and a second input terminal coupled to receive a second voltage corresponding with the predetermined voltage; and
   a second p-channel transistor having a gate coupled to an output terminal of the comparator, a source coupled to the $V_{DD}$ voltage supply terminal, and a drain coupled to the gate of the first p-channel transistor.

21. The integrated circuit of claim 20, further comprising an n-channel transistor having a drain coupled to the gate of the first p-channel transistor, a source coupled to the $V_{SS}$ voltage supply terminal, and a gate coupled to the output terminal of the comparator.

22. The integrated circuit of claim 21, wherein the n-channel transistor is smaller than the second p-channel transistor.

23. The integrated circuit of claim 21, further comprising a resistor coupled between the drain of the n-channel transistor and the gate of the first p-channel transistor.

24. The integrated circuit of claim 20, further comprising one or more diodes coupled between the $V_{DD}$ voltage supply terminal and the first input terminal of the comparator.

25. The integrated circuit of claim 19, further comprising a resistor coupled between the $V_{DD}$ voltage supply terminal and the $V_{CC}$ voltage supply terminal.

26. A method of providing electrostatic discharge (ESD) protection for an integrated circuit, the method comprising:

provided a $V_{DD}$ supply voltage to a $V_{DD}$ voltage supply terminal of the integrated circuit; and routing the $V_{DD}$ supply voltage to a $V_{CC}$ voltage supply terminal of a sensitive core circuit of the integrated circuit as a $V_{CC}$ supply voltage, such that the $V_{CC}$ supply voltage rises slowly with respect to a rising voltage on the $V_{DD}$ voltage supply terminal during power-on of the integrated circuit.

27. The method of claim 26, further comprising enabling an ESD protection circuit coupled to the $V_{DD}$ voltage supply terminal before the $V_{CC}$ supply voltage reaches a voltage that would damage the sensitive core circuit.

28. The method of claim 26, further comprising:

applying a nominal $V_{DD}$ supply voltage to the $V_{DD}$ voltage supply terminal during normal operation of the integrated circuit; and disconnecting the $V_{CC}$ voltage supply terminal from the $V_{DD}$ voltage supply when a voltage on the $V_{DD}$ voltage supply terminal exceeds a predetermined voltage that is greater than the nominal $V_{DD}$ supply voltage.

29. The method of claim 28, further comprising enabling an ESD protection circuit coupled to the $V_{DD}$ voltage supply terminal when the voltage on the $V_{DD}$ voltage supply terminal exceeds the predetermined voltage.

* * * * *